(12) United States Patent
Schober et al.

(10) Patent No.: US 8,525,564 B2
(45) Date of Patent: Sep. 3, 2013

(54) CHARGE-BASED PHASE LOCKED LOOP CHARGE PUMP

(75) Inventors: Susan M. Schober, Huntington Beach, CA (US); Robert C. Schober, Huntington Beach, CA (US)

(73) Assignee: University of Southern California, Los Angeles, CA (US)

( * ) Notice: Subject to any disclaimer, the term of this patent is extended or adjusted under 35 U.S.C. 154(b) by 140 days.

(21) Appl. No.: 13/278,003

(22) Filed: Oct. 20, 2011

(65) Prior Publication Data

US 2012/0098579 A1 Apr. 26, 2012

Related U.S. Application Data

(60) Provisional application No. 61/394,408, filed on Oct. 20, 2010.

(51) Int. Cl.
*H03L 7/06* (2006.01)

(52) U.S. Cl.
USPC .......................................... 327/157; 327/148

(58) Field of Classification Search
USPC .................................................. 327/148, 157
See application file for complete search history.

(56) References Cited

U.S. PATENT DOCUMENTS

| | | | |
|---|---|---|---|
| 4,807,104 A | 2/1989 | Floyd et al. | |
| 4,812,961 A | 3/1989 | Essaff et al. | |
| 5,493,543 A | 2/1996 | Kamens | |
| 6,844,762 B2 * | 1/2005 | Sanchez | 327/157 |
| 7,176,732 B2 | 2/2007 | Innocent | |
| 7,535,272 B1 * | 5/2009 | Kwong et al. | 327/156 |
| 7,616,035 B2 * | 11/2009 | Haerle | 327/157 |
| 7,629,856 B2 * | 12/2009 | Thaller | 331/57 |
| 7,952,424 B2 * | 5/2011 | Sanduleanu et al. | 327/536 |
| 8,035,145 B2 | 10/2011 | Bae et al. | |
| 8,149,038 B1 * | 4/2012 | Sung et al. | 327/231 |
| 8,183,913 B2 * | 5/2012 | Swei et al. | 327/537 |
| 2003/0038661 A1 * | 2/2003 | Chokkalingam et al. | 327/157 |
| 2004/0085104 A1 * | 5/2004 | Sanchez | 327/157 |
| 2005/0068075 A1 | 3/2005 | Innocent | |

(Continued)

FOREIGN PATENT DOCUMENTS

WO 2012054736 A2 4/2012

OTHER PUBLICATIONS

U.S. Appl. No. 60/499,286, filed Aug. 28, 2003, entitled "Device and Method for Increasing the Operating Range of an Electrical Circuit," Manuel Innocent, inventor.

(Continued)

*Primary Examiner* — Adam Houston
(74) *Attorney, Agent, or Firm* — McDermott Will & Emery LLP

(57) ABSTRACT

Charge-based charge pumps are described which include a switchable capacitor configured for connection to a voltage source, a ground, and a charge pump output. A first pair of switches include a first switch configured to connect the switchable capacitor to ground and a second switch configured to connect the switchable capacitor to the voltage source. A second pair of switches include a third switch configured to connect a first node, between the switchable capacitor and ground, to the charge pump output, and a fourth switch configured to connect a second node, between the switchable capacitor and the voltage source, to the charge pump output. Locked loop designs, such as phase locked loops or delay locked loops, are described that include charge-based charge pumps.

20 Claims, 12 Drawing Sheets

(56) References Cited

U.S. PATENT DOCUMENTS

| | | | |
|---|---|---|---|
| 2005/0083090 A1* | 4/2005 | Moraveji | 327/157 |
| 2005/0195003 A1* | 9/2005 | Soe | 327/157 |
| 2005/0237092 A1* | 10/2005 | Kawago et al. | 327/157 |
| 2008/0018382 A1 | 1/2008 | Nagatomo et al. | |
| 2009/0134923 A1* | 5/2009 | Kwong et al. | 327/157 |
| 2009/0243672 A1* | 10/2009 | Singh et al. | 327/157 |
| 2012/0098579 A1* | 4/2012 | Schober et al. | 327/157 |

OTHER PUBLICATIONS

Arshak, K. et al. 2004. Improved Charge Pump for Reduced Clock Feed Through and Charge Sharing Suppression. In Proceedings of the Fifth IEEE International Caracas Conference on Devices, Circuits and Systems, Nov. 3-5, 2004, vol. 1, pp. 192-194.

Chen, Y. et al. 2010. Self-Tracking Charge Pump for Fast-Locking PLL. Electronics Letters, May 27, 2010, vol. 46, No. 11, pp. 755-756.

Craninckx, J. et al. 1998. Phase-Locked Loop Frequency Synthesizers. In Wireless CMOS Frequency Synthesizer Design. Boston/Dordrecht/London: Kluwer Academic Publishers, pp. 25-30.

Craninckx, J. et al. 1998. A Fully Integrated CMOS DCS-1800 Frequency Synthesizer. IEEE Journal of Solid-State Circuits, Dec. 1998, vol. 33, No. 12, pp. 2054-2065.

Fazeel, H.M.S. et al. 2009. Reduction of Current Mismatch in PLL Charge Pump. 2009 IEEE Computer Society Annual Symposium on VLSI, pp. 7-12.

Gardner, F.M. 2005. Chapter 12: Charge-Pump Phaselock Loops. In Phaselock Techniques, Third Edition. Hoboken, NJ: John Wiley & Sons, pp. 271-280.

Hwang, M.-S. et al. 2009. Reduction of Pump Current Mismatch in Charge-Pump PLL. Electronics Letters, Jan. 29, 2009, vol. 45, No. 3, pp. 135-136.

Lee, T.H. 2004. Chapter 16, Section 16.7, Phase-Locked Loops: Loop Filters and Charge Pumps. In the Design of CMOS Radio-Frequency Integrated Circuits, Second Edition. New York: Cambridge University Press, pp. 588-595.

Liu, X. et al. 2010. A pA-Leakage CMOS Charge Pump for Low-Supply PLLs. In 2010 53rd IEEE International Midwest Symposium on Circuits and Systems (MWSCAS), pp. 1037-1040.

Qiang, F. et al. 2010. A Novel Low Voltage and High Speed CMOS Charge Pump Circuit, in 2010 2nd International Conference on Signal Processing Systems ((ICSPS), vol. 3, pp. V3-389 to V3-391.

Quemada, C. et al. 2009. Section 5.6.2, Design of the Charge Pump. In Design Methodology for RF CMOS Phase Locked Loops, Norwood, MA: Artech House, pp. 104-108.

Stephens, D.R. 2002. Chapter 1, "The Early History of Phase-Locked Loops," and Chapter 6, "Charge Pumps, Counters, and Delay-Locked Loops." In Phase-Locked Loops for Wireless Communications: Digital, Analog and Optical Implementations, Second Edition, New York: Kluwer Academic Publishers, pp. 1-9 and 161-178.

Shu, K. et al. 2005. Selection from Chapter 7: "Other Building Blocks of PLL: 7.3.2 Charge Pump Architectures." In CMOS PLL Synthesizers: Analysis and Design, Boston: Springer Science +Business Media, Inc., pp. 171-173.

Vaucher, C.R. 2002. Selection from Chapter 3, "Single-Loop Architectures / PLL Building Blocks," Section 3.3.4: "The Phase-Frequency Detector/Charge Pump Combination." In Architectures for RF Frequency Synthesizers, New York: Kluwer Academic Publishers, pp. 33-38.

Yu, H. et al. 2005. A New High-Speed Low-Voltage Charge Pump for PLL Applications. In ASIC 2005, 6th International Conference of ASICON 2005, vol. 1, pp. 435-438.

Zhang, G. 2010. Linearized Charge Pump Independent of Current Mismatch Through Timing Rearrangement. Electronics Letters, Jan. 7, 2010, vol. 46, No. 1, pp. 33-34.

International Search Report and Written Opinion of the International Searching Authority (ISA/KR), dated Apr. 27, 2012, for PCT Application No. PCT/US2011/057116 (published Apr. 26, 2012 as WO 2012/054736 A2), entitled "Charge-Based Phase Locked Loop Charge Pump," Schober, Susan M. et al., inventors.

* cited by examiner

Charge Pump Waveform During Charging (IDLE)

Charge Pump Waveform to Increase Control Voltage of VCO (Pump UP)

Charge Pump Waveform to Decrease Control Voltage of VCO (Pump DOWN)

1000

Charge Pump Waveform for Non-Overlapping ON Restrictions Between UP and DOWN Signals

CHARGE-BASED PHASE LOCKED LOOP CHARGE PUMP

CROSS-REFERENCE TO RELATED APPLICATION

This application claims priority to and benefit of U.S. Provisional Patent Application Ser. No. 61/394,908 filed Oct. 20, 2010, and entitled "High-Speed Picowatt-Range phase locked loop charge pump," the entire content of which is incorporated herein by reference.

STATEMENT REGARDING FEDERALLY SPONSORED RESEARCH

This invention was made with Government support under Grant No. N66001-09-C-2081, awarded by the Defense Advanced Research Projects Agency (DARPA). This invention was made with Government support under Grant No. EEC-0310723, awarded by the National Science Foundation (NSF). The Government has certain rights in the invention.

BACKGROUND

The phase locked loop (PLL) is one of the basic building blocks in circuits of today's advanced system designs. The charge pump based phase locked loops are utilized in most devices that synthesize a high-frequency reference signal. This means that most modern day communication systems, data encoders/decoders, CPU chips, cell phones, and digital radios have one or more embedded charge pumps.

FIG. 1 depicts a block diagram of a prior art phase locked loop 100 having a current-based charge pump 102. PLL 100 also includes a phase/frequency detector 104, a loop filter 106, a voltage controlled oscillator (VCO) 108, and a divider 110. In operation, the voltage output of the charge pump 102 is supplied to the loop filter 106, e.g., a single capacitor or multiple capacitors possibly with one or more resistors. The loop filter in turn is the control input to the VCO. As a PLL continuously operates, the phase/frequency detector 104 compares the feedback clock signal to a reference clock signal. In response to an error signal (a difference indicated by the comparison), the phase/frequency detector 104 sends an UP or DOWN signal to the charge pump 102, which in turn adjusts the voltage output of the loop filter 106. The loop filter 106 then adjusts the output of the VCO 108, which provides its output to divider 110 to again provide an input to phase/frequency detector 104. The cycle then repeats as needed to achieve a lock on the desired signal, e.g., reference clock signal.

The main contributors to power consumption in prior art PLLs such as 100 are the charge pump 102 and the VCO 108; the phase/frequency detector 104, loop filter 106, and divider(s) 110 generally have smaller power consumption. Prior art PLL charge pumps constantly consume current in the bias circuitry. For example, in a prior art PLL, a current-based charge pump typically consumes on average 0.5 to 1.0 mW of power for a supply voltage of 1.8 V.

FIG. 2 depicts a circuit diagram 200 of the prior art phase locked loop 100 of FIG. 1. Charge pump 102 includes two current mirrors with current sources 202 and 204, respectively. In response to UP or DOWN signals from the phase/frequency detector 104, the current sources 202 and 204 can be isolated from or connected to loop filter 106 by switches 206 and 208, respectively.

Prior art PLL charge pumps, such as shown in FIG. 2, are current-based devices that act like an ideal integrators where the output voltage, CP_Output, is equivalent to the following:

$$V_c(t) = \frac{1}{Cp} \int_{-\infty}^{t} i(\tau) d\tau \rightarrow V_c(s) = \frac{1}{sCp} i(s). \quad [\text{EQ. 1}]$$

When UP(t)=1, the top switch 206 closes and $I_1$ will charge the equivalent loop filter capacitive load, C_LoopFilter. Therefore, Vc(t) will start increasing linearly with time. The opposite will happen if DOWN(t)=1. Assuming no offset or mismatch (an ideal case), PLL 100 using the charge pump in FIG. 2 will lock with zero steady-steady state phase error. A tiny phase error results in an indefinite charge accumulation on the loop filter 106 if phase lock is not sufficiently precise, resulting in phase jitter induced on the VCO 108, which is an undesirable condition. Having a precise phase lock point can reduce phase jitter. A precise phase lock point can be obtained from a precise (in time) resolution obtained from short delays and no dead time between UP and DOWN modes of operation.

Since prior art charge pumps, e.g., as shown in FIG. 2, are current-based devices, the effect of mismatch between $I_1$ and $I_2$ leads to reference spurs, which are undesirable. When the PLL is locked (e.g., CLOCK_Feedback matches CLOCK_Reference), both the reference and feedback signals are exactly the same in frequency and phase, which is the desired condition. Therefore, the switches in the CP will be on for only a short instant injecting currents $I_1$ and $-I_2$ to/from the loop filter 106. Ideally, $I_1=I_2$ in magnitude and the switches are perfect, leading to a net charge injected to/from CP being exactly zero.

Unfortunately, in practice, $I_1$ and $I_2$ are not 100% equal due to process variation, mismatch in the transistors and current mirrors, imperfect switches, and timing of the inputs. A significant problem with such current-based devices is that the net charge into/from the charge pump 102 is not zero, causing an error voltage $\Delta V$ across the loop filter 106. This causes the VCO frequency, which is controlled by the charge pump output, to shift corresponding to $\Delta V$. This in turn causes the CLOCK_Feedback to not match the CLOCK_Reference signal. Since the PLL is a feedback loop system, the phase/frequency detector 104 and the charge pump 102 will have to constantly reset the voltage control line to the VCO to set its frequency and phase. Overall, the control voltage toggles between two values with the input frequency thus creating a sawtooth waveform which the loop filter 106 attempts to remove. The loop filter 106 generally has issues removing all of these variations. Any small unwanted movements on the control voltage signal will then produce tiny differences on the VCO frequency. This asymmetry of charge vs. discharge can be accommodated by the loop filter 106, but the modulation of control voltage also creates unwanted sidebands at the PLL output, which is an undesirable condition. These sideband (or spurs) can create a problem in both receivers and transmitters by causing noise.

Other common drawbacks or disadvantages of current-based PLL charge pumps include the following:

High power consumption (e.g., ~0.5 mW to 1 mW with a supply voltage of 1.8 V in the prior art) due to the current mirrors (several currents going up and down to bias the charge pump). The currents must be run high enough to overcome the transients of switching the current mirrors on and off. Current mirrors are not easily switched on and off quickly and tend to take a long period of time to stabilize.

For prior art PLL charge pumps it can be difficult to switch current sources on and off for short periods of time, as is required for establishing a clean voltage for locked conditions. It takes time to turn linear current mirrors on and off, especially when their settling time to a constant current, and the residual burst of current at turn off are considered. The current mirrors in prior art PLL charge pumps are normally switched off by interrupting the source connection of the output current mirror. The current mirrors are switched on by connecting the current mirror source to its respective power rail (Vdd or Gnd). The gate-source voltage that controls the current mirror output is typically very small and thus sensitive to the current the current mirror produces. A drop in this at turn on and a spike at turn off produces transient errors in the output current. Since the gate-to-source voltage on the current mirrors controls their output current, it is not a good idea to have the switch in series with the gate-to-source connection of the mirror transistor (i.e., stacking the mirror on top of the switch).

One technique to mitigate the DC errors of the current mirror output for such current-based PLL charge pumps, has been to add an extra transistor, that is sized to match the necessary switch transistor, to the current mirror devices in a particular current mirror group. Those extra transistors that are added are typically all turned on hard (e.g., Vgs>>Vth). This can result in extra complexity and reduce robustness.

Another problem of prior art current-based PLL charge pumps can be that if there is any current flowing in the power supply wires that connect the current mirrors together, a voltage between the mirror transistors is established, which modulates the charge pump output current. Therefore, there are a lot of ways to pick up noise in current mirrors.

A further drawback of prior art current-based PLL charge pumps is that the mirror transistors are large and take up significant area on an integrated circuit. As feature sizes get smaller, current sources lose manufacturing repeatability (precision) thus matching current mirror transistors (which are typically large) becomes more difficult. As a result, current-based PLL charge pumps typically have employed designs with enough margin to dominate process parameter variations. Typically this has meant that the charge pumps have been designed to run at a higher current in order for all of the corner parameters to pass.

Additionally, such current-based charge pumps of the prior art typically have exhibited a large amount of noise near the equilibrium point (e.g., in phase lock); this can introduce noise on the control voltage output, which must be filtered in the loop filter to keep a stable VCO frequency and phase. Such noise is usually undesirable. For example, it is widely known that it is very important in radio frequency (RF) circuits to maintain a low jitter on the high frequency clock which is the VCO.

SUMMARY

Aspects of the present disclosure and subject technology address disadvantages noted previously by providing a novel design of a charge pump, based on charge redistribution (charge-based) through the use of a switched charge transfer element such as a capacitor. The subject technology can provide for high speed and low power consumption relative to prior art charge pumps.

An aspect of the present disclosure is directed to and can provide a charge-based charge pump including: a switchable capacitor configured for connection to a voltage source, a ground, and a charge pump output; a first pair of switches including a first switch configured to connect the switchable capacitor to ground and a second switch configured to connect the switchable capacitor to the voltage source; and a second pair of switches including a third switch configured to connect a first node, between the switchable capacitor and ground, to the charge pump output, and a fourth switch configured to connect a second node, between the switchable capacitor and the voltage source, to the charge pump output.

A further aspect of the present disclosure is directed to and can provides a phase-locked loop (PLL) including: (i) a charge-based charge pump including, a switchable capacitor configured for connection to a voltage source, a ground, and a charge pump output; a first pair of switches including a first switch configured to connect the switchable capacitor to ground and a second switch configured to connect the switchable capacitor to the voltage source; and a second pair of switches including a third switch configured to connect a first node, between the switchable capacitor and ground, to the charge pump output, and a fourth switch configured to connect a second node, between the switchable capacitor and the voltage source, to the charge pump output; (ii) a phase/frequency detector configured to provide an UP or DOWN signal to the charge-based charge pump and to receive a reference clock signal and a feedback clock signal; (iii) a loop filter configured to receive an output voltage signal from the charge-based charge pump and provide an output voltage signal; and (iv) a voltage controlled oscillator (VCO) configured to receive the output signal from the loop filter and provide an output signal to the phase/frequency detector.

While certain embodiments are depicted in the drawings, one skilled in the art will appreciate that the embodiments depicted are illustrative and that variations of those shown, as well as other embodiments described herein, may be envisioned and practiced within the scope of the present disclosure.

BRIEF DESCRIPTION OF THE DRAWINGS

The drawing figures depict one or more implementations in accord with the present teachings, by way of example only, not by way of limitation. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps. The drawings are not necessarily to scale, emphasis instead being placed on the principles of the disclosure. In the drawings.

Figure 1:
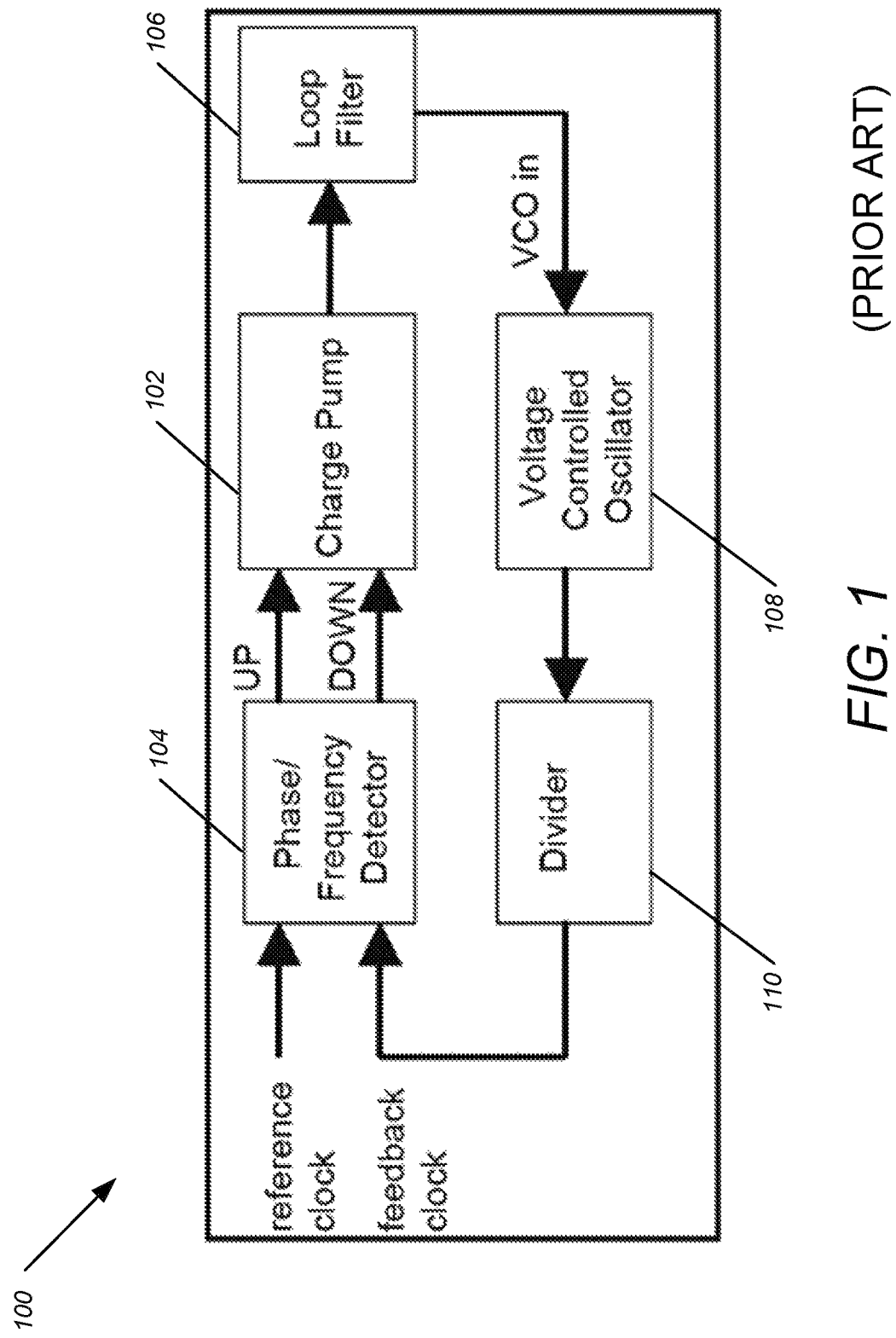
FIG. 1 depicts a block diagram of a prior art phase locked loop having a current-based charge pump.
Figure 2:
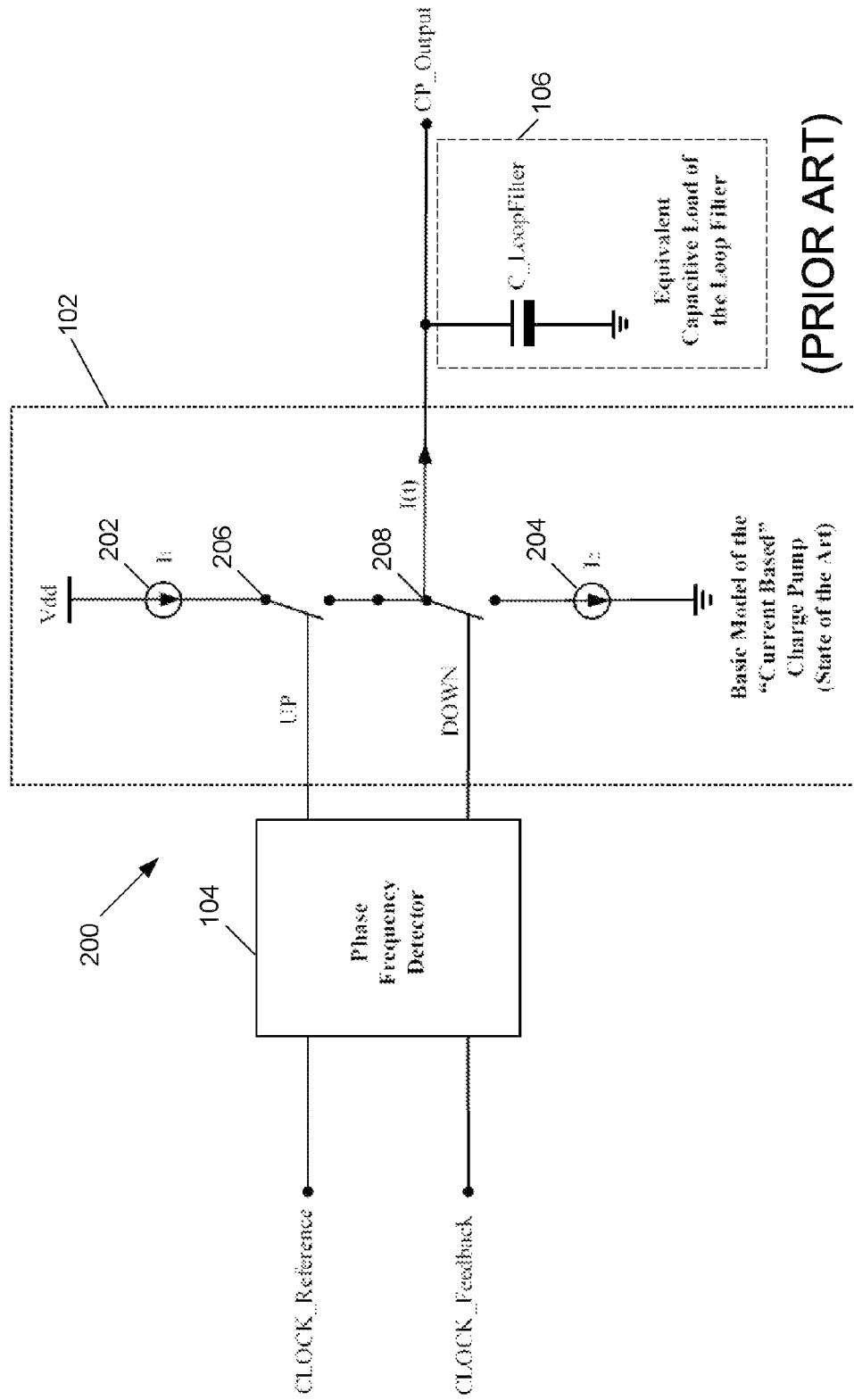
FIG. 2 depicts a circuit diagram of the prior art phase locked loop of FIG. 1.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Systems and methods of the present disclosure provide for and/or facilitate implementation or use of a novel design of a charge pump, based on charge redistribution (charge-based) through the use of a switched charge transfer device (e.g., capacitor), as opposed to current-based charge pumps of the prior art. An aspect of such charge-based technology generally includes a switchable charge transfer device (e.g., capacitor) and four or more switches. Such charge-based charge pumps can be digital in nature and can utilize logic control signals from a phase/frequency detector to drive the switches, e.g., transistors or transistor pairs, fully ON ("1") or OFF ("0"). Exemplary embodiments can utilize a switchable or "flying" capacitor. The charge transfer device (capacitor) can transfer either a positive or a negative charge depending on how it is switched.

Aspects of the subject technology can provide a number of advantages relative to the prior art. For example, aspects of the subject technology can yield greater speed than analog circuits such as prior art current-based charge pumps, which must settle to a design current each time when switched on. Switched charge transfer circuits of the subject technology can also offer the ability to deliver finer resolution correction signals and significant power saving compared to switched current source circuits of prior art charge pumps. Further, multiple component tracking scenarios can be mitigated or avoided altogether by examples of the subject technology, and linear circuitry can be avoided that would require matching.

Additional advantages can include an increase in manufacturing yield by implementation of charge pumps of the subject technology because of the elimination of the need for precision or matched components. The charged-based (switched capacitor) approach of the subject technology can also offer a smaller integrated circuit footprint due to the elimination of the large transistors required for current sources. Such charge-based charge pumps can also achieve reduced phase jitter noise. Unlike the conventional current-based approaches of prior art charge pumps, which oscillate around the set point, charge pumps of the subject technology take steps that become increasingly smaller as the set point is approached to the point that they disappear altogether in the steady state. Thus, their output voltages can approach a target voltage value without exceeding that value. Additionally, higher speed acquisition and finer phase resolution can contribute to a more stable, jitter free, precision phase locked loop (or delay locked loop) system. Additional improvement can be realized by using different value switched capacitor circuits depending on whether the system is in or out of frequency lock. Multiple-mode embodiments may be implemented to combine ultra-fast frequency lock with ultra-fine phase lock.

Exemplary embodiments of charge-based charge pumps according to the subject technology can be implemented as high-speed low-power phase locked loop charge pumps used in a PLL of an integrated circuit; such PLLs can be used for many different applications, including, but not limited to, radio design, communications, and computers, etc. Further embodiments of charge-based charge pumps according to the subject technology can be implemented in other types of locked loop circuits and designs such as delay locked loops and the like.

Figure 3:
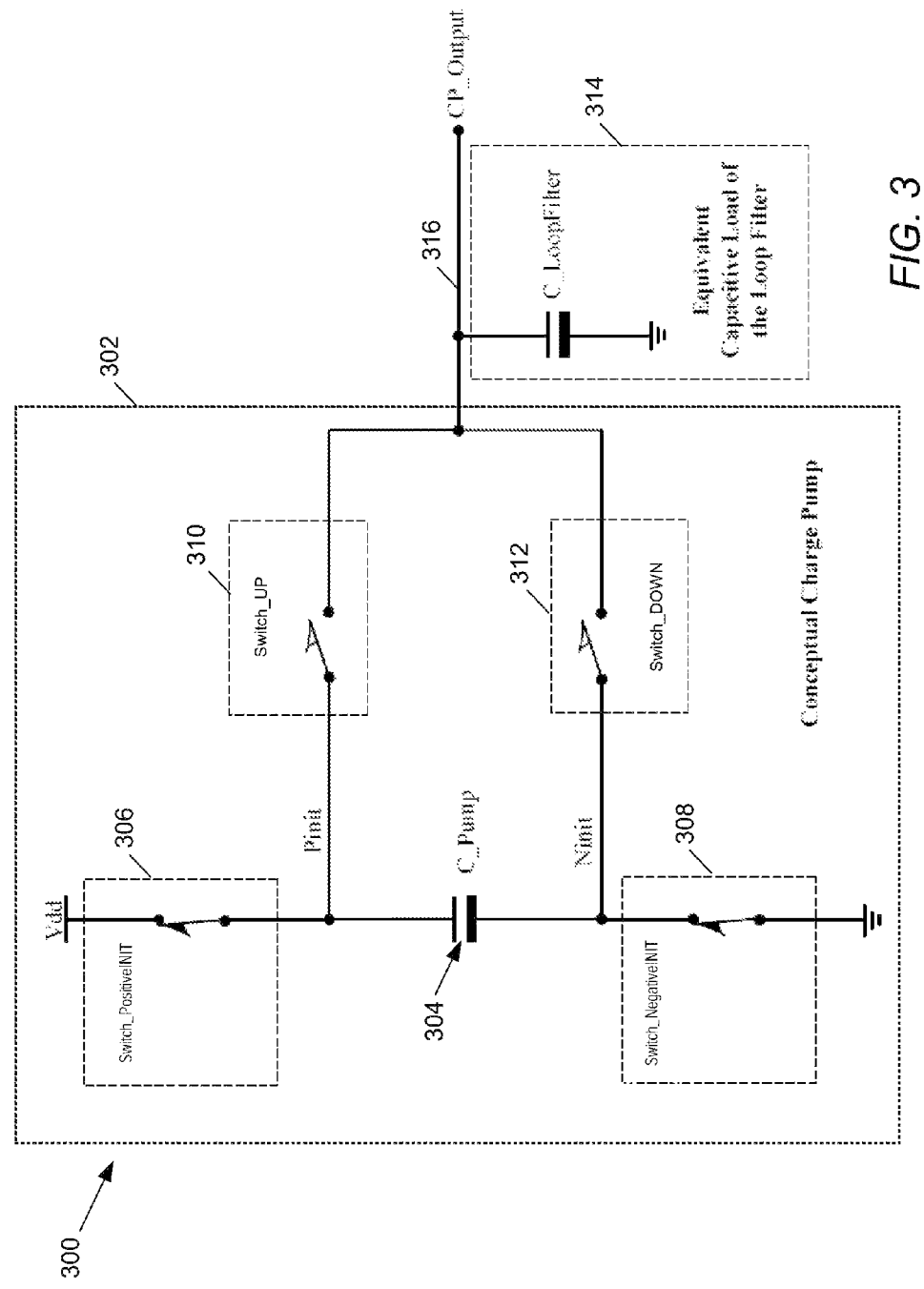
FIG. 3 depicts a circuit diagram of an example of a charge-based charge pump according to the present disclosure.

FIG. 3 depicts a block circuit diagram 300 of an example of a charge-based charge pump 302 according to the present disclosure. As shown, charge pump 302 includes a switchable charge transfer device in the form of a switchable or "flying" capacitor 304 configured between a supply voltage, Vdd, and ground. A first pair of switches 306 and 308 are present and can connect the switchable capacitor 304 to the supply voltage and ground, respectively. As an indication of the functions the switches perform, they are labeled in FIG. 3 as Switch_PositiveINIT and Switch_NegativeINIT, respectively. A second pair of switches 310 and 312 are also present and can connect the switchable capacitor to an output 316 of the charge pump. As an indication of the functions the switches perform, they are labeled in FIG. 3 as Switch_UP and Switch_DOWN, respectively. Also as shown, the charge pump output 316 can be connected to a loop filter 314. The equivalent capacitive load, C_LoopFilter, of the loop filter is shown. The charge pump 302 and loop filter 314 may be implemented in a locked loop circuit in exemplary embodiments.

Figure 4:
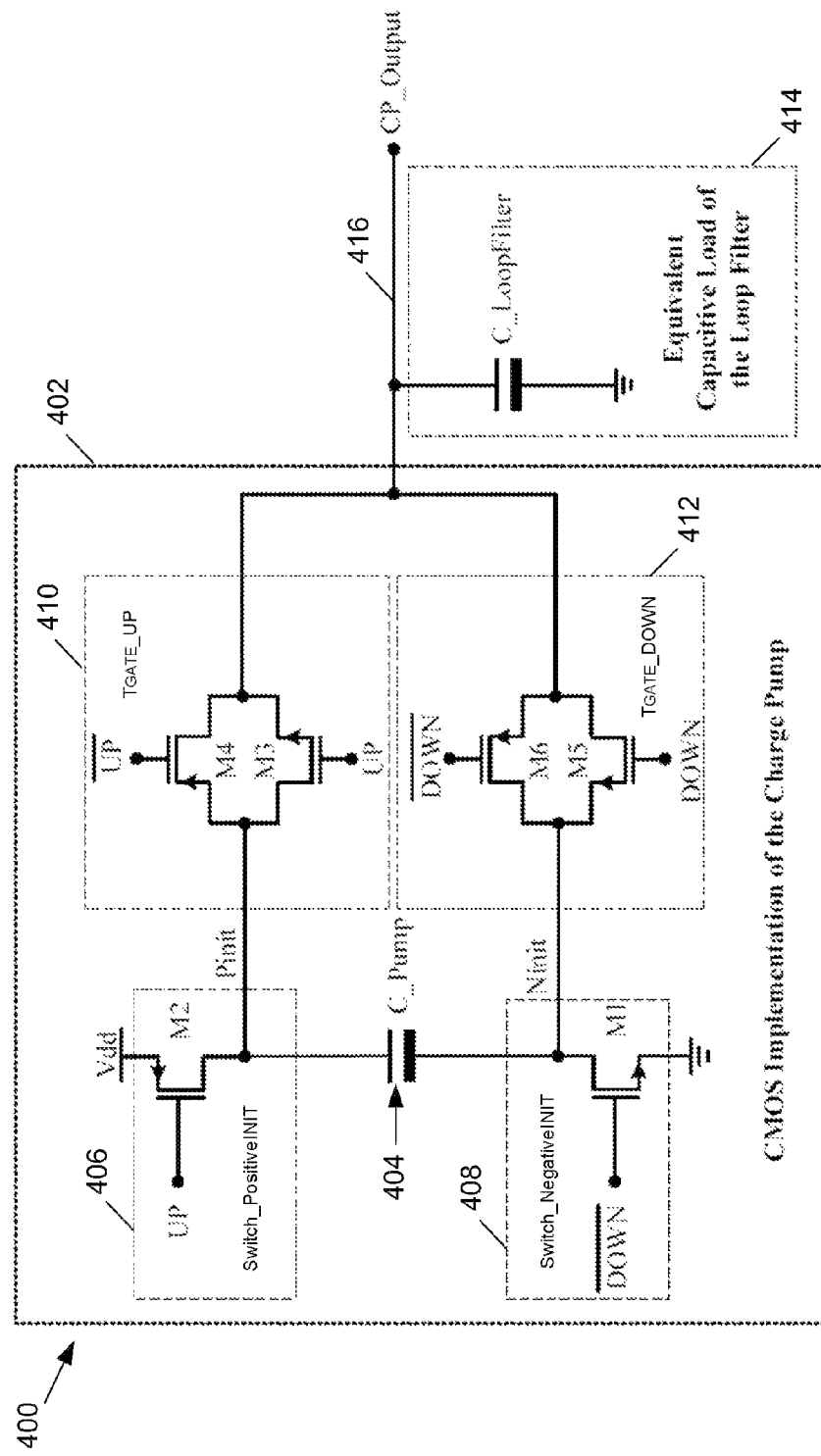
FIG. 4 depicts a transistor level circuit diagram of an implementation of a charge-based charge pump according to the present disclosure.

FIG. 4 depicts a transistor level circuit diagram 400 of an implementation of a charge-based charge pump 402, according to the present disclosure. Similar to charge pump 302 of FIG. 3, charge pump 402 includes a switchable charge transfer device in the form of a switchable or "flying" capacitor 404 configured between a supply voltage, Vdd, and ground. A first pair of switches 406 and 408, indicated as CMOS implementations M2 and M1, respectively, are present and can connect the switchable capacitor 404 to the supply voltage and ground, respectively. A second pair of switches 410 and 412 are also present and can connect the switchable capacitor to an output 416 of the charge pump. As shown, the charge pump output 416 can be connected to a loop filter 414. The equivalent capacitive load, C_LoopFilter, of the loop filter is shown in the drawing.

With continued reference to FIG. 4, switches 410 and 412 each include a pair of transistors. Switch 410, provided with label TGATE_UP, includes transistors M3 and M4, which are configured to accept inputs on UP and $\overline{UP}$ lines, respectively. Switch 412, provided with label TGATE_DOWN, includes transistors M5 and M6, which are configured to accept inputs on DOWN and $\overline{DOWN}$ lines, respectively. NMOS and PMOS designations for M1-M6 are shown for an exemplary embodiment in which M1, M3, and M5 are NMOS devices and M2, M4, and M6 are PMOS devices. Of course, other devices or configurations may be used in other embodiments.

As shown and described for FIGS. 5-10, charge pump 402 can have three modes of operation: Charging, Pump UP, and Pump DOWN.

Figure 5:
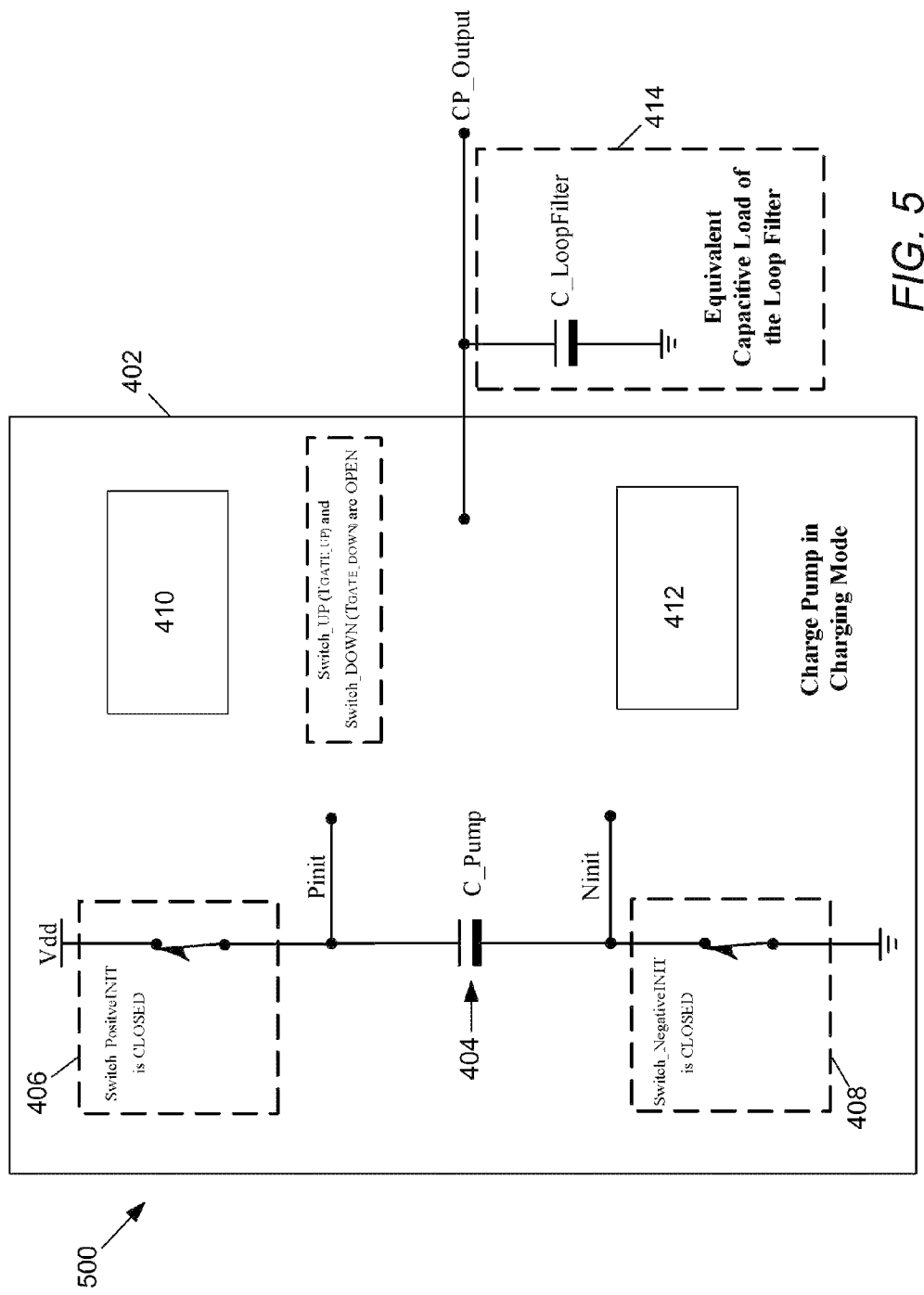
FIG. 5 depicts the charge-based charge pump of FIG. 4 in charging or idle mode.

FIG. 5 depicts the charge-based charge pump of FIG. 4 in charging or idle mode 500, which may be an initial state of the charge pump 402. Such a mode 500 can correspond to when a related phase/frequency detector is not commanding the charge pump 402 to Pump UP or Pump DOWN (which in FIG. 4 would be denoted by a high signal on UP or DOWN, respectively). In mode 500, the CP_Output 416 sits constant at an initialized value or previous value without any variation. Both transmission or pass gates (410 and 412) are open (isolating switchable capacitor 404 from CP_Output 416), and switches 408 (M1) and 406 (M2) are closed. This mode 500 allows for charging of the switchable capacitor 404 by way of the connections of the Pinit node to the voltage source (Vdd) and the Ninit node to ground (Gnd).

Figure 6:
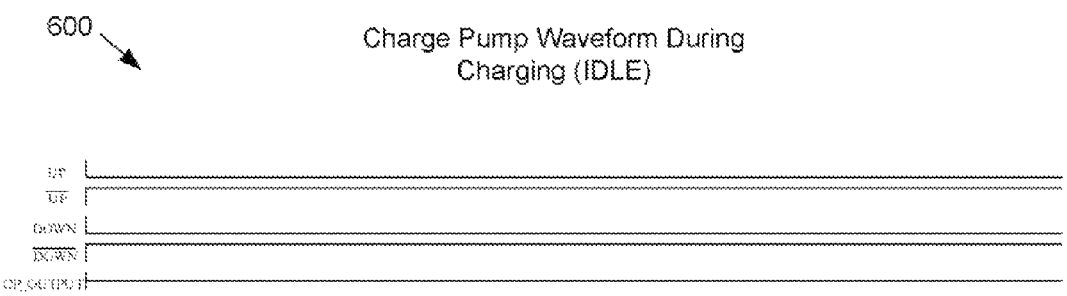
FIG. 6 depicts voltage waveforms corresponding to the circuit elements of FIG. 5.

FIG. 6 depicts a set 600 of voltage waveforms corresponding to the circuit elements of FIG. 5. As shown, voltages on the UP and DOWN lines are OFF or 0 while voltages on the $\overline{UP}$ and $\overline{DOWN}$ lines are ON or 1. The CP_OUTPUT is shown as constant for operational mode 500.

Figure 7:
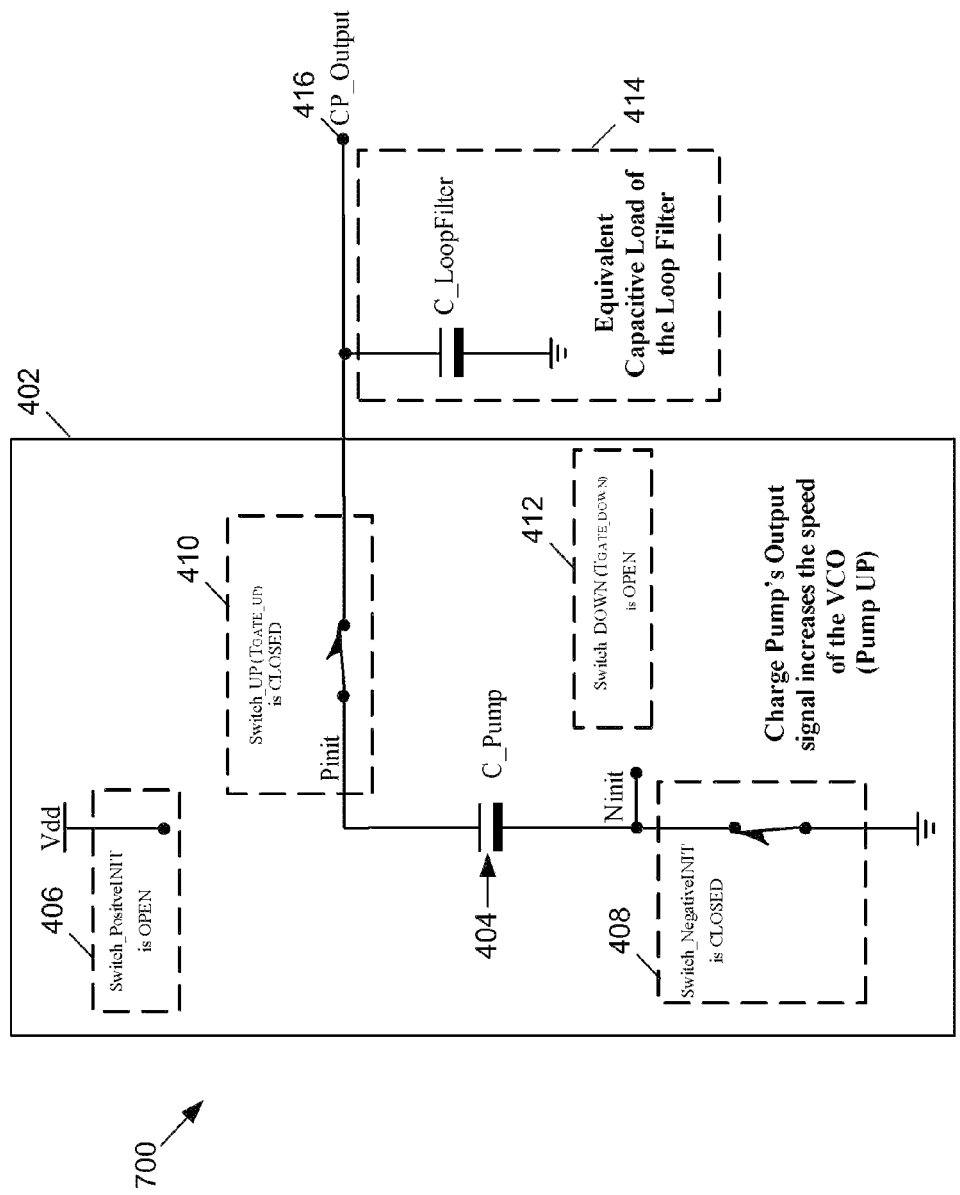
FIG. 7 depicts the charge-based charge pump of FIG. 4 in pump UP mode.

FIG. 7 depicts the charge-based charge pump 402 of FIG. 4 in pump UP mode 700. The Pump UP mode 700 is denoted by an UP signal of Vdd while DOWN stays at Gnd. In the Pump Up Mode of operation, charge pump 402 changes the waveform of its output 416 by opening the 406 switch (M2 transistor corresponding to Switch_PositiveINIT) and also the Switch_Down pass gate 412. Switch 408 (M1 transistor corresponding to Switch_NegativeINIT) stays closed from the previous charging mode 500 of FIG. 5, so that Ninit stays at Gnd, like it was during the charging mode 500. Switch 410 (Switch_UP) is closed during the Pump UP mode thus creating a path to loop filter 414 (where C_LoopFilter indicates the capacitive load representation of the loop filter stage). Some of the charge in switchable capacitor 404, that was stored during the previous charging mode 500, is then transferred over pass gate (of switch 410) to the output node (shown at 416) through charge sharing to equalize the voltage and thus increases the voltage on the output load capacitor 414, e.g., by a few millivolts. In a PLL implementation, the control voltage on the output of the charge pump can control the frequency of the VCO (which may or may not increase or decrease proportionately—dependent on actual VCO design) to the charge pump output voltage, which is the same as the VCO control voltage. The result of this operation is illustrated in FIG. 8, described below.

With continued reference to FIG. 7, the CP_Output, at 416, can be initialized to a desired voltage value, e.g., at 900 mV or any other value from +Vdd (1.8 Volts in this example) to as low as 0.0 Volts. In an implemented embodiment initialized at 900 mV, at 28 MHz, the Cp_Output at 416 settled within 8% of the output signal. Depending on the size of the switchable capacitor 404 (labeled as C_Pump) and the capacitance of the loop filter 414 (labeled as C_LoopFilter); the step size of the voltage waveform at the charge pump output 416 can be adjusted. For example, when C_Pump is set at 50 fF and C_LoopFilter is 5 pF, the step size is 1 mV. When C_Pump is set at 500 fF and C_LoopFilter is 5 pF, the step size is 10 mV. Therefore, a fine adjustment can be made to match a small phase difference or a coarse adjustment can be done to obtain frequency acquisition. In some embodiments, either two (or more) charge-based charge pumps could be used in parallel, e.g., after a phase/frequency detector in a PLL or a capacitor array could be implemented as a switchable charge transfer device (C_Pump) to choose such values.

Figure 8:
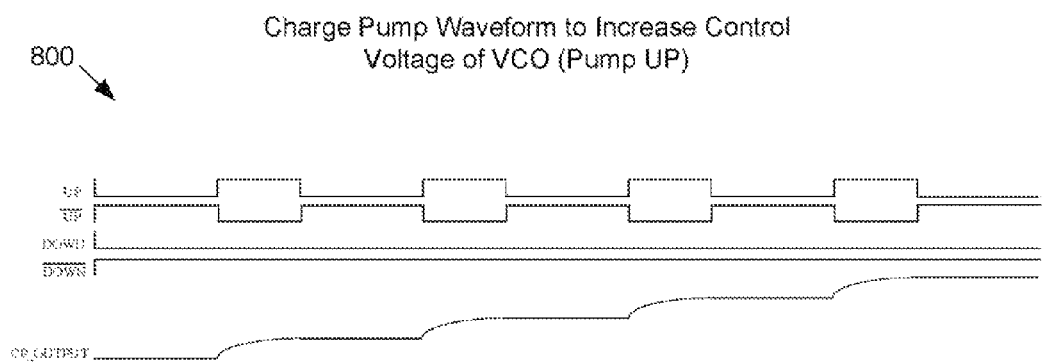
FIG. 8 depicts voltage waveforms corresponding to the circuit elements of FIG. 7.

FIG. 8 depicts voltage waveforms corresponding to the circuit elements of FIG. 7. As shown, voltages on the UP and $\overline{UP}$ lines are opposite or complementary to each other; when one switches from OFF (or 0) to ON (or 1), the other changes in the opposite manner. Voltages on the DOWN and $\overline{DOWN}$ lines are OFF (0) and ON (1), respectively. The CP_OUTPUT is shown as increasing in steps for operational mode 700.

Figure 9:
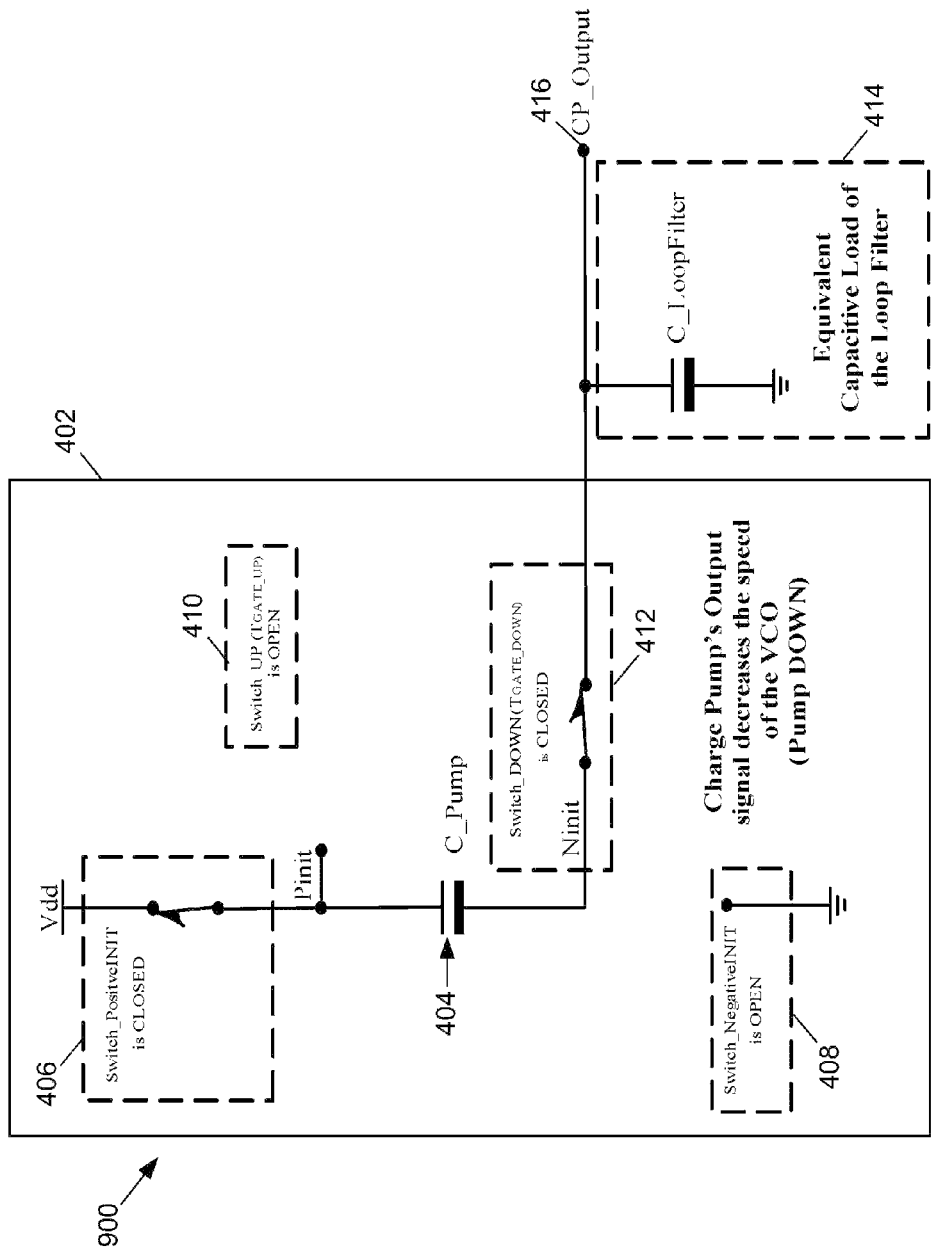
FIG. 9 depicts the charge-based charge pump of FIG. 4 in pump DOWN mode.
Figure 10:
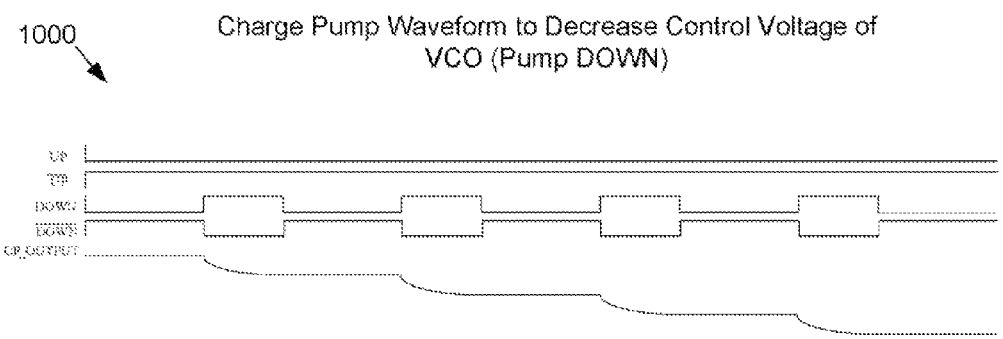
FIG. 10 depicts voltage waveforms corresponding to the circuit elements of FIG. 9.

FIG. 9 depicts the charge-based charge pump 402 of FIG. 4 in Pump DOWN operational mode 900. The Pump DOWN mode 900 is denoted by a DOWN signal of Vdd while UP stays at Gnd. In the Pump DOWN Mode of operation, the charge pump 402 re-configures its switches by opening switch 408 (M1 transistor corresponding to Switch_NegativeINIT) while maintaining switch 410 (Switch_UP pass gate) open and switch 406 (M2 transistor corresponding to Switch_PositiveINIT) stays closed from the previous Charging Mode 500, so that Pinit stays at Vdd, like it was during the Charging Mode 500. Switch 412 (Switch_DOWN transmission gate) is closed during the Pump DOWN mode 900 thus creating a path from switchable pump 404 (C_Pump) to the loop filter 414 (C_LoopFilter representing the capacitive load the loop filter stage). Through charge sharing, some of the excess charge that was stored in the loop filter capacitance 424 (C_LoopFilter) is then transferred over pass gate to the CP_Output node 414 and thus charges down the output load capacitor. This operational mode 900 is illustrated in FIG. 10. For operational mode 900, the CP_Output can be initialized to a desired voltage value, e.g., at 900 mV or any other value from 0.0 Volts to as high as 1.8 Volts as an example. In an exemplary implemented embodiment, at 28 MHz, the CP_Output settled within 8% of the output signal. Depending on the relative sizes of C_Pump and C_LoopFilter, the step increment of the output voltage waveform at 416 can be adjusted as desired. For example, when C_Pump is set at 50 fF and C_LoopFilter is 5 pF, the step increment is −1 mV. For further example, when C_Pump is set at 500 fF and C_LoopFilter is 5 pF, the step increment is approximately −10 mV for a full charge sharing transfer during the coarser frequency difference detection mode of phase and frequency detection. Thus, the larger the C_Pump capacitor values are with respect to the C_LoopFilter capacitance, the faster the phase lock is approached. Conversely, the smaller the C_Pump capacitor 404, the finer the phase adjustment is near phase lock. When the frequencies are essentially matched, the phase and frequency detector acts as a phase detector. For the embodiment shown, the phase difference is narrowed down as phase lock is approached. For the example frequency of approximately 28 MHz, with a clocking period of 36 ns, a 1 ns time difference is equivalent to approximately 10 degrees of phase difference. As this phase difference is narrowed down, the time difference reduces the amount of time available for charge sharing to transfer charge from the C_Pump flying capacitor to the C_Loop_Filter capacitance, thus causing the phase difference to be fine adjusted with increments that approach zero for a smoothed phase lock. This step size reduction as phase lock is approached works the same in either direction of approach to phase lock.

FIG. 10 depicts voltage waveforms corresponding to the circuit elements of FIG. 9 in operational mode 900. As shown, voltages on the UP and $\overline{UP}$ lines are OFF (0) and ON (1), respectively opposite or complementary to each other; when one switches from OFF (or 0) to ON (or 1), the other changes in the opposite manner. Voltages on the DOWN and $\overline{DOWN}$ lines are opposite or complementary to each other; when one switches from OFF (or 0) to ON (or 1), the other changes in the opposite manner. The CP_OUTPUT is shown as decreasing in steps for operational mode 700.

Exemplary Embodiments

Implementation Considerations

For implementing switched capacitor circuits, e.g., as in exemplary embodiments of charge-based charge pumps according to the subject technology, timing between OFF and ON is preferably carefully controlled so as to not cause momentarily shorted signals. Such control, in general, can be effected by always turning switches OFF before turning related switches ON. Care can be exercised in getting both leading and trailing edge of the switch control signals (such as UP or DOWN) so as to not have a crossover time applied to both leading and trailing edges of the switch control signals. This can avoid loss of charge during switching. The trailing edge of the control signals should be considered, in addition to the leading edge, as either could cause significant momentary shorting conditions. In general, switches preferably are turned off quickly and turned on slowly or in a delayed fashion, in order to avoid crossover. Since logic is generally much faster than analog, another approach to this problem regarding not being able to turn one switch off before another related switch is turned on, can be to switch much faster than the analog signals can transfer voltage errors. The fast switch approach has its limiting error defined by the minimum pulse width that can deliver charge to the loop filter, e.g., filter 416, which is typically around 10 to 100 picoseconds as an example; while the non-overlapping approach has its error limits defined by delay uncertainty in this illustrative example implementation approximately in the range of 100 ps to around 400 ps. This switching time manifests itself in the form of a dead band around the phase lock time period, which is equivalent to the dead time between switching. Since this dead time error band can be approached from either UP or DOWN direction, it can be the limiting accuracy of phase lock. For instance, such a time can result in one degree of phase error for every 100 ps of non-overlap time (using a 36 ns clocking period or 28 MHz). Comparatively, the prior art current mirror charge pump requires typically around 1 to 5 ns to switch, resulting in a dithering around the target voltage so that about 20 degrees of phase noise is generated that the loop filter is used to smooth out.

In exemplary embodiments of charge-based charge pumps according to the subject technology, the transmission gate devices, e.g., NMOS and PMOS devices, preferably have approximately the same channel area for balanced charge transfer (between gate to source and gate to drain) when they are switched. When the transistors are turned ON, a channel charge results that effectively represents a capacitor (or capacitance) between the gate and the channel. At turn OFF, this charge is split between source and drain. The difference between the NMOS and PMOS charges is an error added to the load capacitance of the loop filter. Therefore, by using a transmission gate with NMOS and PMOS transistors, this is a first order correction (if the signal voltage of the channel is at half scale) of that error because the charges are about equal. If the signal is near one of the rails (Vdd or Gnd), one transistor will have a large channel charge and the other will not have any because it is already OFF. Since a switched capacitor charge pump circuit is being used inside a control loop, the numerical accuracy in this special case is not ultimately important. The concern is that this capacitance should not overwhelm the charge that is being transferred from the switched (flying) capacitor. This consideration (and similar ones for related parasitic capacitances) can provide a minimum value that can be used for the flying capacitor. The ratio between the switched (flying) capacitor and the loop filter capacitance determines the step size of charge pump output. This establishes the step size when not in frequency lock (e.g., when significantly different frequencies are being compared), or effects the minimum step size as phase lock is approached.

Figure 11:
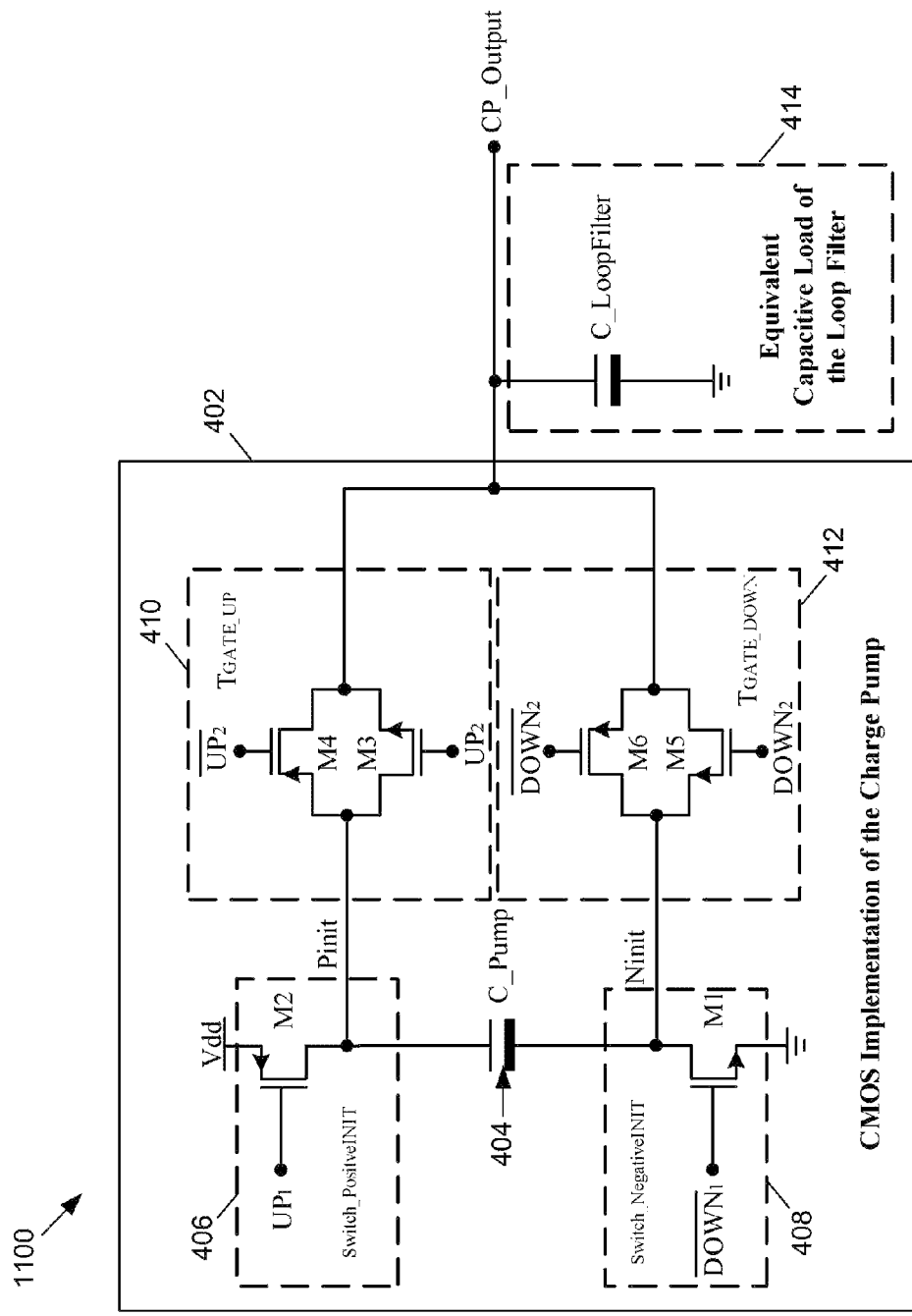
FIG. 11 depicts a transistor level circuit diagram of a CMOS implementation of a charge-based charge pump with non-overlapping "ON" restrictions between UP and DOWN signals, according to the present disclosure.

With reference to FIG. 11, another consideration in exemplary embodiments of a switched capacitor charge pump circuit is the avoidance of a logic race condition on $\overline{\text{DOWN}}$ or UP inputs. FIG. 11 depicts charge-based charge pump 402 in an operational condition 1100 with non-overlapping "ON" restrictions between UP and DOWN signals, according to a further aspect of the present disclosure. A race condition, which is preferably avoided, could potentially occur when both switch 408 (M1) or switch 406 (M2) and respective inputs to the respective pass gates, are ON. To prevent such a race condition, the transmission gates and initialization transistors M1 (or M2) should not be on at the same time.

Figure 12:
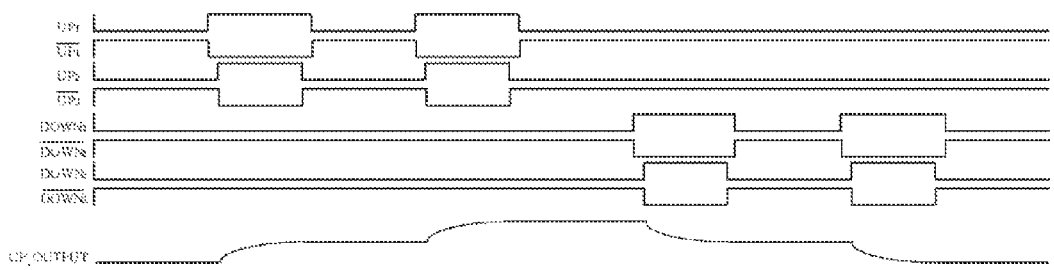
FIG. 12 depicts voltage waveforms corresponding to the circuit elements of FIG. 11.

FIG. 12 depicts a set 1200 of voltage versus time waveforms corresponding to the circuit elements of FIG. 11. In FIG. 12, the waveforms are shown with all inputs (depicting ON and OFF times) along with the resulting CP_Output. The UP2 and DOWN2 (and their compliments) signals are derived from the original desired UP and DOWN (and their compliments), now referred to a UP1 and DOWN1. These UP2 and DOWN2 (and compliments) signals can be generated by simple logic. FIG. 12 depicts the waveform for these inputs and the output, in Pump UP, IDLE, and Pump DOWN modes (as indicated by the depicted pulses).

If there is a large amount of error due to dead zone in a related phase/frequency detector, a charge pump, e.g., 402, can still perform as desired. By placing a non-overlapping logic gating at the charge pump inputs, such switching errors can be prevented from propagating, e.g., to the related phase/frequency detector. Again, if there is no phase error, the output of the charge pump stays completely constant and does not dither up or down, thus allowing the VCO to acquire phase lock. This scheme may, however, have a very small dead band, e.g., around a degree of phase lock difference. In this small dead band, the charge pump can be inactive, thus reducing power and phase jitter encountered in dithering. The noise floor is preferably around these values. Such a dead band scheme may lower the high frequency phase jitter encountered in such phase locked loop searching. It will be appreciated that charge-based charge pumps according to the subject technology may also be used not only with a VCO but also any type of controlled oscillator; examples include but are not limited to current controlled oscillators (ICOs) and the like.

With continued reference to FIG. 12, for the condition when an associated VCO is exactly at the proper frequency and phase, the charge pump may not be given signals to go UP and DOWN, and will temporarily sit IDLE without any change on CP_Output. This is the most desired operating mode for a charge pump, because it does not put any pumping noise on the VCO control signal. In practice, dithering is commonly seen around the locked VCO frequency and phase due to the large loop gain that demands this condition in PLLs. PLL loop filter blocks, such as those that typically follow general charge pumps, can be employed to filter this dithering noise out to eliminate phase and frequency noise. Therefore, it is desirable to have the smallest possible step in the CP_Output so that the PLL loop filter block has an easier job filtering out this noise. The downside is that a constant small step takes a longer time to lock due to the smaller transfer of charge to/from C_LoopFilter. In exemplary embodiments of the subject technology, staging a larger charge transfer capacitor, C_Pump2, in parallel with C_Pump, or adding an alternate "course" charge pump in parallel to the "fine" charge pump following the PFD and tied to the same CP_Output, can allow for faster frequency acquisition if desired.

Accordingly, aspects and embodiments of the present disclosure can provide one or more of the following:

The use of a charge-based approach (not "current-based" as in the prior art) which uses charge redistribution employing switched capacitors (using the charge and discharge of a relatively small C_Pump capacitor for charge redistribution).

Reduced power demands as charge-based charge pumps use very little power due compared with prior art current-based charge pumps. For example, in a National CMOS 180 nm process implementation with a supply voltage of 1.8 Volts, a charge-based PLL charge pump utilized approximately 250 picoWatts of power. Prior art charge pumps typically consume around 0.5 mW to 1 mW of power with a similar supply voltage. This is greater than a one million (1×10E6) times improvement over prior art charge pump and extremely desirable for battery powered wireless devices, like cell phones or implantable biomedical devices, where power consumption is an enormous challenge.

Charge-based charge pumps according to the subject technology can be used with virtually any type of transistor: any type of transistor including any type of field effect transistor (FET) including junction field effect transistors—including MOS and CMOS—or a bipolar junction transistor (BJT); any type of semiconductor material or alloy, including silicon, germanium, silicon germanium (SiGe), silicon-on-insulator (SOI), gallium arsenide (GaAs), aluminum gallium arsenide (AlGaAs), indium and alloys including indium, and the like; and, any type of process producing any feature size, e.g., 180 nm, through 45 nm, 32, nm, etc.

As was noted previously, the PLL is one of the basic building blocks in today's advanced system designs. Therefore, reducing the power in the phase locked loop by use of charge-based charge pumps of the subject technology can have a pronounced impact on the power consumption of many overall systems, particularly battery powered devices. While such improved charge pump designs—when considered in isolation—may or may not significantly increase net battery life (battery life of a wireless device is largely system design specific on not usually based on any one component)—they can contribute significantly to an overall program of power savings. Further, the increased precision with higher performance afforded by charge-based designs may enable other power saving scenarios when incorporated into a phase locked loop design or a delay locked loop or any other locked loop design.

A very significant advantage afforded by aspects of the subject technology is that such charge-based charge pumps are essentially digital circuits that work consistently and predictably—not subject to parametric processing parameters like threshold voltage. They can also operate in weak to moderate inversion of the transistors. In contrast, prior art charge pumps are analog devices which consume larger amounts of power, chip area, and are subject to parametric variations that greatly affect performance.

Charge-based charge pumps according to the subject technology can utilize a small number of transistors as switches (e.g., six transistors) and one small capacitor (e.g., approximately 50 fF to 500 fF though embodiments will also work with more or less capacitance) for charge redistribution. Embodiments of a charge pump according to the subject technology can be made with only four transistors (switches) and still work (although not fully to the supply rails—Vdd and/or Gnd) by eliminating the Up and Down Transmission gates and replacing those transmission gates with either NMOS or PMOS transistors. Therefore, the charge-based charge pumps according to the subject technology use a much simpler switching design with fewer transistors and/or components than the prior art charge pumps (resulting in a smaller active area on chip). The individual transistors that are used may generally be much smaller compared to the transistors utilized in prior art charge pumps.

Charge pumps of the subject technology can provide better control over the output of the related phase locked loop (or other locked loop design) because the step size of the charge pump decreases as the PLL system frequency and/or phase error decreases. The ratio of C_Pump to C_Load capacitance controls the charge pump resolution and by changing this ratio the variable oscillator can be caused to move more rapidly in cases where frequency lock has not been achieved. This control results in a more precise phase lock with less jitter imposed on the variable oscillator because of a quieter control voltage at phase lock. Additional parallel switched capacitor(s) could be activated to decrease the number of cycles needed for coarser frequency lock and de-activated for finer phase lock.

A further advantage is that current mirrors, which inject noise on the output voltage while adding mirror gain errors, can be avoided.

A charge-based charge pump can be utilized in an "any order" locked loop system. For instance, a PLL is generally a second order locked loop. A Delay Locked Loop (DLL) is similar to a PLL, but is usually a first order system based on clock recovery, and generally uses a charge pump. Therefore, this charge pump can be utilized in both a PLL and DLL or any other order locked loop system.

An exemplary embodiment of a high-speed low-power charge-based phase locked loop charge pump has been fully designed, fabricated, and tested in National CMOS 180 nm process.

Aspects of the system and methods of outlined above may be embodied in programming. For example, circuit designs of PLLs and/or charge pumps according to the subject technology may be designed with or stored in software products that include programming. Program aspects of the technology may be thought of as "products" or "articles of manufacture" typically in the form of executable code and/or associated data that is carried on or embodied in a type of non-transitory machine readable medium. "Storage" type media include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer, processor, or device into another, for example, from a management server or host computer of the service provider into the computer platform of the application server that will perform the function of the push server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-volatile storage media include, for example, optical or magnetic disks, such as any of the storage devices in any computer(s), server(s), or the like, such as may be used to implement the push data service shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. The foregoing notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A charge-based charge pump comprising:
a switchable capacitor configured for connection to a voltage source, a ground, and a charge pump output;
a first pair of switches including a first switch configured to connect the switchable capacitor to ground and a second switch configured to connect the switchable capacitor to the voltage source; and
a second pair of switches including a third switch configured to connect a first node, between the switchable capacitor and ground, to the charge pump output, and a fourth switch configured to connect a second node, between the switchable capacitor and the voltage source, to the charge pump output.

2. The charge-based charge pump of claim 1, wherein the first pair of switches comprise a pair of CMOS transistors.

3. The charge-based charge pump of claim 2, wherein the pair of CMOS transistors comprise a NMOS transistor and a PMOS transistor.

4. The charge-based charge pump of claim 1, wherein the third switch of the second pair of switches comprises a NMOS transistor and a PMOS transistor.

5. The charge-based charge pump of claim 1, wherein the fourth switch of the second pair of switches comprises a NMOS transistor and a PMOS transistor.

6. The charge-based charge pump of claim 1, wherein the first switch of the first pair of switches comprises a bipolar junction transistor (BJT).

7. The charge-based charge pump of claim 1, wherein the second switch of the first pair of switches comprises a bipolar junction transistor (BJT).

8. The charge-based charge pump of claim 1, wherein the third switch of the second pair of switches comprises a bipolar junction transistor (BJT).

9. The charge-based charge pump of claim 1, wherein the fourth switch of the second pair of switches comprises a bipolar junction transistor (BJT).

10. The charge-based charge pump of claim 1, wherein the first switch of the first pair of switches comprises a transistor including gallium arsenide (GaAs).

11. The charge-based charge pump of claim 1, wherein the second switch of the first pair of switches comprises a transistor including gallium arsenide (GaAs).

12. The charge-based charge pump of claim 1, wherein the third switch of the second pair of switches comprises a transistor including gallium arsenide (GaAs).

13. The charge-based charge pump of claim 1, wherein the fourth switch of the second pair of switches comprises a transistor including gallium arsenide (GaAs).

14. The charge-based charge pump of claim 1, wherein the charge pump is implemented by a CMOS 180 nm process.

15. The charge-based charge pump of claim 1, wherein the charge pump is configured to supply an output voltage that approaches and does not exceed a target voltage.

16. A phase-locked loop (PLL) comprising:
 (i) a charge-based charge pump including,
  a switchable capacitor configured for connection to a voltage source, a ground, and a charge pump output;
  a first pair of switches including a first switch configured to connect the switchable capacitor to ground and a second switch configured to connect the switchable capacitor to the voltage source; and
  a second pair of switches including a third switch configured to connect a first node, between the switchable capacitor and ground, to the charge pump output, and a fourth switch configured to connect a second node, between the switchable capacitor and the voltage source, to the charge pump output;
 (ii) a phase/frequency detector configured to provide an UP or DOWN signal to the charge-based charge pump and to receive a reference clock signal and a feedback clock signal;
 (iii) a loop filter configured to receive an output voltage signal from the charge-based charge pump and provide an output voltage signal; and
 (iv) a voltage controlled oscillator (VCO) configured to receive the output signal from the loop filter and provide an output signal to the phase/frequency detector.

17. The PLL of claim 16, further comprising a divider between the VCO and phase/frequency detector, wherein the divider is configured to receive the output signal from the VCO, scale the frequency by a desired scale factor, and provide the resulting signal to the phase/frequency detector.

18. The PLL of claim 17, wherein the first pair of switches comprise a pair of CMOS transistors.

19. The PLL of claim 17, wherein the third switch of the second pair of switches comprises a NMOS transistor and a PMOS transistor.

20. The PLL of claim 17, wherein the fourth switch of the second pair of switches comprises a NMOS transistor and a PMOS transistor.

* * * * *